United States Patent [19]

Morimoto et al.

[11] Patent Number: 4,952,421
[45] Date of Patent: Aug. 28, 1990

[54] METHOD FOR REPAIRING A PATTERN

[75] Inventors: Hiroaki Morimoto; Hiroshi Onoda; Tadashi Nishioka, all of Hyogo, Japan

[73] Assignee: Mitsubishi Denki Kabushiki Kaisha, Tokyo, Japan

[21] Appl. No.: 269,756

[22] Filed: Nov. 8, 1988

[30] Foreign Application Priority Data

Feb. 2, 1988 [JP] Japan .................................. 63-23270

[51] Int. Cl.$^5$ .............................................. B05D 3/06
[52] U.S. Cl. .................................... 427/43.1; 427/140; 250/492.3
[58] Field of Search ....................... 204/192.11, 192.34, 204/298 BD, 298 BE; 250/492.21; 427/35, 36, 38, 53.1, 140, 250, 43.1; 430/5

[56] References Cited

U.S. PATENT DOCUMENTS

| | | | |
|---|---|---|---|
| 4,250,832 | 2/1981 | Ozaki | 250/492.21 X |
| 4,457,803 | 7/1984 | Takigawa | 204/298 BE X |
| 4,605,566 | 8/1986 | Matsui et al. | 427/43.1 |
| 4,636,403 | 1/1987 | Fisanick et al. | 427/140 X |
| 4,698,236 | 10/1987 | Kellogg et al. | 427/140 X |
| 4,724,159 | 2/1988 | Yamazaki et al. | 427/53.1 X |

OTHER PUBLICATIONS

SPIE: "Electron-Beam, X-Ray, Ion-Beam Techniques for Submicrometer Lithographies V" by P. D. Blais, vol. 632; 11-12, Mar. 1986, pp. 97-102.
J. Vac. Sci. Technol.: "Computer Simiilation of Current Density Profiles in Focused Ion Beams", by J. W. Ward, B5 (1), Jan./Feb. 1987, pp. 169-173.

*Primary Examiner*—Nam X. Nguyen
*Attorney, Agent, or Firm*—Lowe, Price, LeBlanc, Becker & Shur

[57] ABSTRACT

The method for repairing the pattern is to repair the lacking portion of the pattern included in the X-ray exposure mask with the WF$_6$ gas being filled in the vicinity thereof, wherein the focused ion beam irradiates the defect portion, whereby the WF$_6$ gas is decomposed to form a tungsten thin film so as to at least fill the lacking portion. On this occasion, the focused ion beam is successively applied so that it is always in contact with the edge of the tungsten thin film constituting the pattern.

11 Claims, 7 Drawing Sheets

METHOD FOR REPAIRING A PATTERN

BACKGROUND OF THE INVENTION

1. Field of the Invention

The present invention relates to a method for repairing a pattern and to an exposure mask repaired by the method and, more specifically, it relates to a method for repairing a circuit pattern formed on a semiconductor substrate in a semiconductor device such as large scale integrated circuit device or the pattern of the exposure mask which is the original of the circuit pattern.

2. Description of the Prior Art

As a method for repairing defects of the above mentioned patterns with high precision, a method employing focused ion beam (hereinafter referred to as "FIB") is known. This method is disclosed in, for example, "Submicron mask repair using focused ion beam technology", Proceedings of SPIE, vol. 632, Electron-Beam, X-Ray, & Ion-Beam Techniques for Submicrometer Lithographies V, P. 97–103 (1986), by M. Yamamoto et al. According to the article, the defects of the mask patterns are repaired by employing sputter etching or deposition technique by the focused ion beam. The method for repairing defects disclosed in the article will be hereinafter described.

Figure 1:
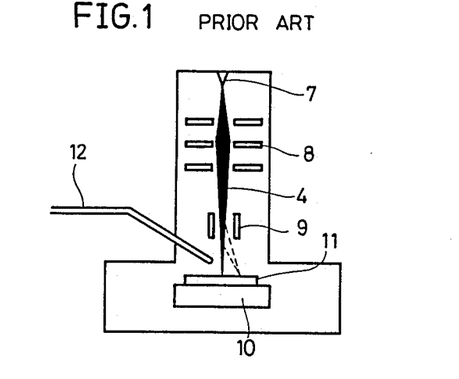
FIG. 1 shows the concept of the pattern repairing apparatus employing a focused ion beam.
Figure 2A:
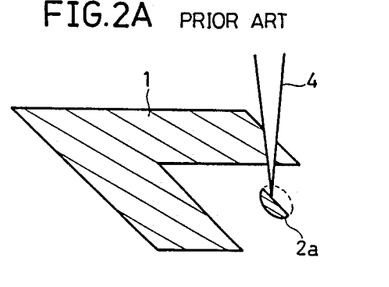
FIGS. 2A and 2B illustrate the method for repairing the defect in the pattern by the focused ion beam.
Figure 2B:
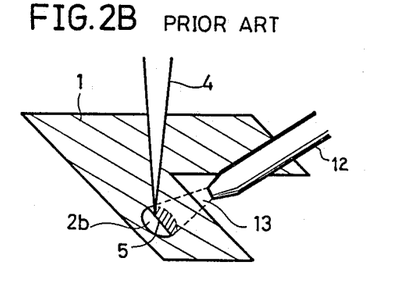
Figure 3:
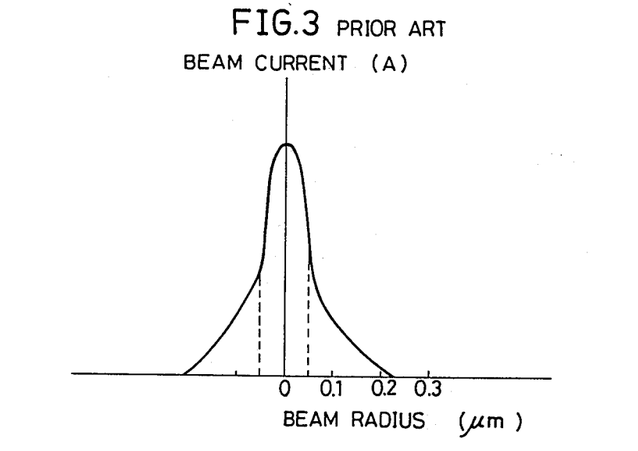
FIG. 3 is a graph showing the current distribution of the focused ion beam.
Figure 4:
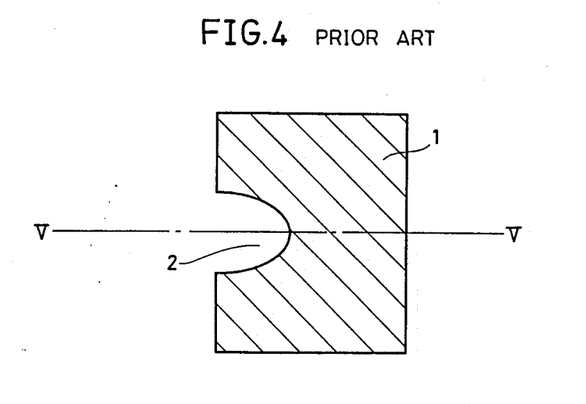
FIG. 4 is a plan view showing a conventional method for repairing the pattern.
Figure 5A:
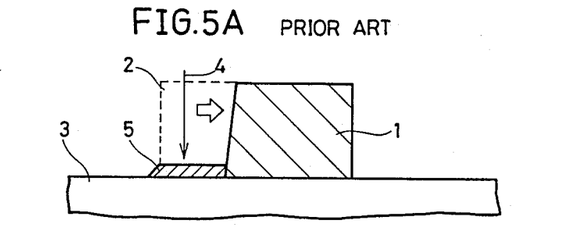
FIGS. 5A, 5B and 5C are cross sectional views showing the conventional method for repairing the pattern in the stepwise manner.
Figure 5B:
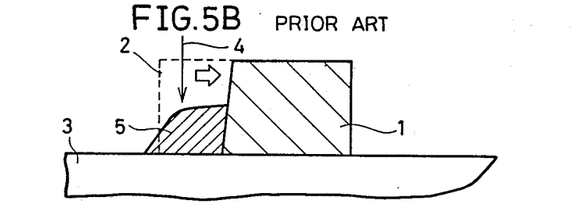
Figure 5C:
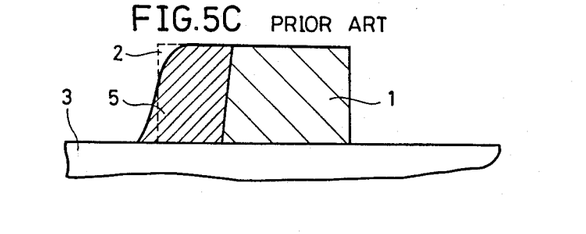
Figure 6A:
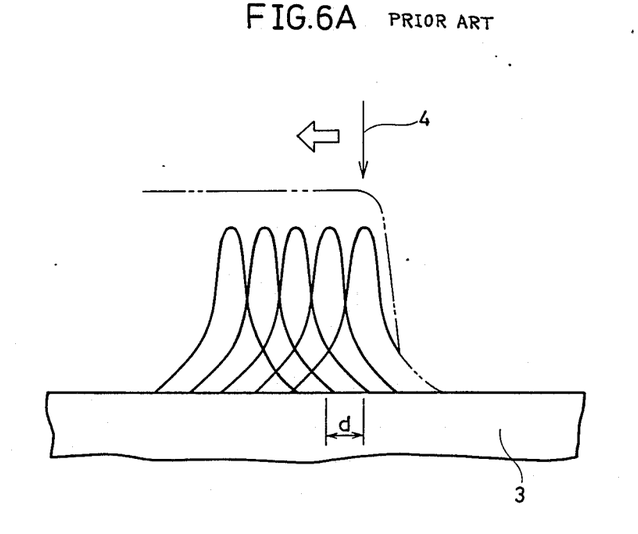
FIGS. 6A and 6B show the relation between the distribution of energy which is applied to the substrate by the scanning of the ion beam and the shape of the thin film formed on the substrate according to the conventional method for repairing the pattern.
Figure 6B:
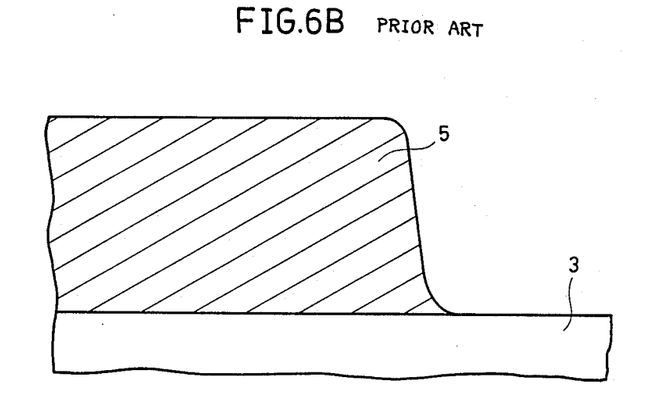

FIG. 1 shows the conception of the pattern defect repairing apparatus employing FIB, FIGS. 2A and 2B illustrate the method for repairing the defect employing the apparatus, FIG. 3 shows the current distribution of the employed FIB, FIGS. 4 and 5A to 5C are plan view and cross sectional views showing the defect portion of the pattern for illustrating the problems in repairing the defects when the film of the pattern is thick, and FIGS. 6A and 6B illustrate the cause of the problem.

Referring to FIG. 1, the ion beam 4 emitted from an ion source 7 is focused by an electrostatic lens 8. The focused ion beam 4 irradiates the sample 11, being focused on the surface of the sample 11 (for example a mask having a pattern, wafer and the like) which is mounted on the sample table 10. On this occasion, in order to effect ion beam irradiation on the desired position of the sample 11, the ion beam 4 is deflected by the beam deflector 9. On the surface of the sample 11, a gas including the material of a thin film formed with a pattern on the surface is supplied by a gas nozzle 12.

The method for repairing the defect will be hereinafter described with reference to FIGS. 2A and 2B. Referring to FIG. 2A, a pattern 1 of a thin film is formed on a substrate and a thin film which is an unnecessary pattern remains as a defect portion 2a. In this case, the ion beam 4 irradiates the defect portion 2a and the defect portion 2a is removed by sputter etching. In FIG. 2B, a defect portion 2b exists in the pattern 1 formed of a thin film, in which the pattern is lacked or there is a missing portion such as a pin hole. In this case, a gas 13, which is an organometallic gas such as $WF_6$, trimethylaluminum, or the like or the hydrocarbon gas is discharged from the gas nozzle 12, and the gas 13 is supplied in the vicinity of the defect portion 2b, and the defect portion 2b is irradiated by the ion beam 4 simultaneously. By doing so, the gas 13 is decomposed by an irradiation of the ion beam 4, and the metal, carbon and the like which is the component of the gas selectively forms a thin flim on the defect portion 2b. In this manner, the defect portion 2b is repaired. Such method for repairing the defects is simple and having high repairing precision of about ±0.1 μm, so that it can be extremely effective means for repairing the defects in a pattern.

However, if the thin film having the pattern to be repaired has the thickness more than 0.2 μm, the side surface of the pattern edge at the repaired portion in repairing the lacking of the pattern does not become vertical to the substrate surface but has the shape with the edge inclined.

FIG. 4 shows a plan view of a pattern 1 comprising a defect portion 2 which has a lacking portion and FIGS. 5A to 5C are cross sectional views taken along the line V—V of FIG. 4 in the order of the process for repairing the defect. A description will be given of a X-ray exposure mask as an example of the thin film having a pattern which is thicker than 0.2 μm. In this case, a tungsten (W) film of 1 μm thickness is employed as the pattern 1 and a silicon nitride film (SiN) is employed as the substrate 3. Tungsten hexafluoride ($WF_6$) is employed as the gas (13 in FIG. 2B) supplied for forming the thin film. The ion beam is a gallium (Ga) ion beam which is focused in 0.1 μm of diameter on the sample and the beam current thereof is 200 pA.

First, referring to FIG. 5A, the $WF_6$ gas is supplied in the defect portion 2 while the ion beam 4 is irradiated at the defect portion 2 of the pattern lacking. The ion beam 4 successively scans the defect portion 2 to form a deposition film 5 of tungsten (W) having a prescribed thickness on the entire surface of the defect portion 2 shown by the dotted line.

Thereafter, as shown in FIG. 5B, the above mentioned scanning of ion beam is successively repeated for a plurality of times to form a thick deposition film 5, whereby the deposition film 5 of tungsten having the desired thickness (in this case 1 μm) is selectively formed to repair the defect. In this manner, the defect portion 2 is filled with the deposition film 5 as shown in FIG. 5C, thereby completing the repairing of the defect portion. However, in this case, the side surface of the edge of the deposition film 5 is not vertical to the surface of the substrate 3, being off from the ideally repaired shape as shown by the dotted line and has the inclined shape.

Now, the ion beam 4 has the current distribution such as shown in FIG. 3. FIG. 3 shows the case in which the full-width at half maximum is 0.1 μm, with the foot of the current distribution extending rather widely. This is discussed in "Computer simulation of current density profiles in focused ion beams", Journal of Vacuum Science and Technology B, vol. 5, No. 1 (Jan/Feb), 1987, p. 169~174, by J. W. Ward et al. According to the above mentioned article, the beam profile of the focused ion beam has the shape approximately the same as the Gaussian distribution at the central portion of the beam but has the shape with largely extended foot at the peripheral portion of the beam.

Due to the shape of the foot of the ion beam current distribution, the side surface of the edge of the tungsten deposition film 5 is not vertical to the surface of the substrate 3 but has the inclined shape as shown in FIG. 5C. The reason for this will be described in the following.

FIG. 6A illustrates the distribution of energy applied to the substrate 3 by the ion beam 4 in correspondence to the above described ion beam current distribution. According to the figure, the energy which is approximately proportional to the beam current distribution shown in FIG. 3 is applied to the substrate 3 as the ion beam 4 successively moves and scans the substrate 3 by a prescribed interval d. The total sum of the energy is denoted by the two-dotted line. When the ion beam 4 irradiates the substrate 3 with such energy distribution and the gas is supplied to the substrate 3, the deposition film 5 having the cross section such as shown in FIG. 6B is formed. As is apparent from the figure, the edge of the deposition film 5 reflects the extension of the foot of the beam current distribution.

As for the X-ray exposure mask, the edge side surface of the mask pattern should be almost vertical to the substrate surface in order to gain high contrast in transferring into the resist pattern on the wafer by using the mask. However, as shown in FIG. 5C, the edge of the repaired defect portion is inclined, so that the constrast in pattern transfer is lowered and the quality of the transferred pattern is degraded with such mask having the repaired pattern is used.

In addition, in repairing the defects of the wiring pattern formed on the semiconductor substrate such as a semiconductor device, when a wiring film having high aspect ratio, that is, narrow width and large thickness is formed in a small region in order to provide high wiring density, if the edge of the repaired defects is inclined, it may cause a short circuit between adjacent wiring patterns or a film having enough film thickness may not be formed, causing a lowered reliability of the wiring pattern.

SUMMARY OF THE INVENTION

The present invention was made to solve the above described problems.

An object of the present invention is to provide a highly reliable method for repairing a pattern.

Another object of the present invention is to provide a repaired exposure mask in which the contrast is not lowered in pattern transfer.

A further object of the present invention is to provide a method for repairing a pattern in which the shape of the edge side surface become almost vertical to the substrate surface.

The method for repairing a pattern in accordance with the present invention comprises a method for repairing a thin film pattern formed on a substrate, comprising the following steps.

First, a substrate is prepared which has a main surface, and a thin film formed thereon selectively spaced apart in accordance with a prescribed pattern, wherein the thin film has a defect portion in which a portion of the prescribed pattern is lacking. Thereafter, a gas comprising the same kind of material as the thin film, or other material of a thin film having the same function as the thin film has is filled in the vicinity of the defect portion. Thereafter, an energy beam having a prescribed energy is selectively applied to the defect portion, thereby decomposing the gas and forming a thin film so as to at least fill the defect portion. The energy beam is continuously applied so that at least it is always in contact with the edge of the thin film.

According to a preferred embodiment, the thickness of the thin film is more than 0.2 μm and the thin film pattern formed on the substrate constitute a portion of the exposure mask. The exposure mask may be the X-ray exposure mask. The employed energy beam is a focused ion beam, the gas is $WF_6$ gas and the thin film is tungsten film.

The exposure mask in accordance with the present invention has a thin film pattern which is repaired with the defect portion filled by the above described method for repairing the pattern.

In accordance with the present invention, the energy beam, which selectively irradiates the defect portion, continuously irradiates with the beam always being in contact with the edge of the thin film. Therefore, the gas is dissolved by the energy beam and the thin film which is formed fills the lacking portion of the pattern along the edge of the thin film during the repair, maintaining the shape thereof. Therefore, the pattern is repaired with the shape of the edge side surface being almost vertical to the substrate surface. Since the shape of the edge side surface of the exposure mask having the pattern repaired in this manner is almost vertical to the substrate surface, the contrast is not lowered in transferring pattern.

These objects and other objects, features, aspects and advantages of the present invention will become more apparent from the following detailed description of the present invention when taken in conjunction with the accompanying drawings.

DESCRIPTION OF THE PREFERRED EMBODIMENT

One embodiment of the present invention will be hereinafter described with reference to FIGS. 7, 8A to 8C and 9A to 9C.

Figure 7:
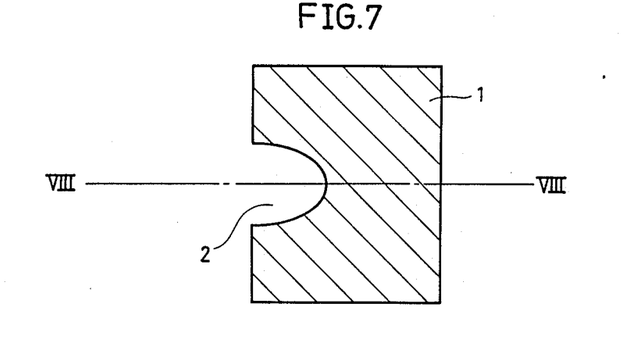
FIG. 7 is a plan view illustrating the method for repairing the pattern in accordance with the present invention.
Figure 8A:
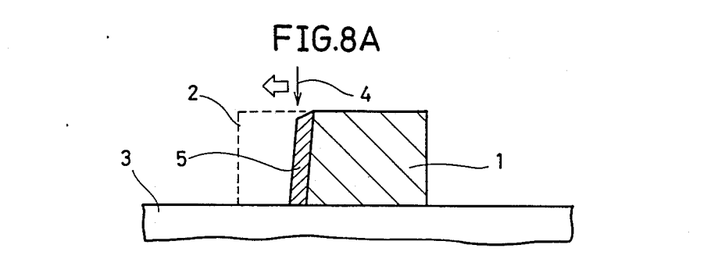
FIGS. 8A, 8B and 8C are cross sectional views showing the method for repairing the pattern in accordance with the present invention in the stepwise manner.
Figure 8B:
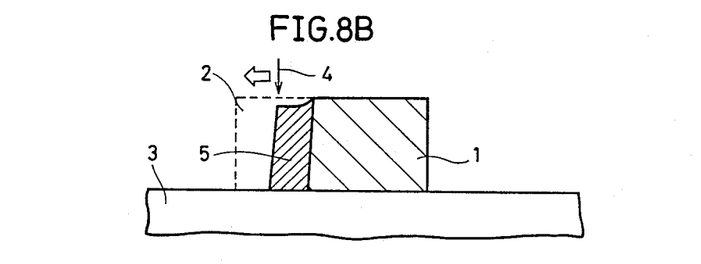
Figure 8C:
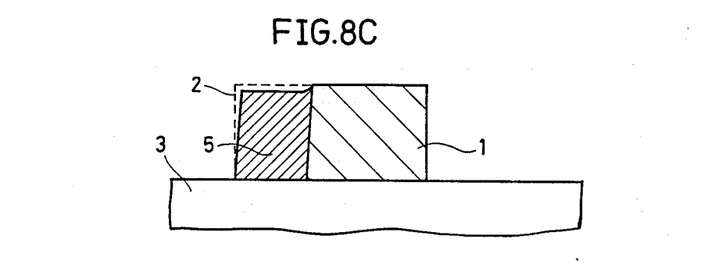

FIG. 7 is a plan view showing a pattern 1 having a defect portion 2 which is a lacking portion and FIGS. 8A to 8C are cross sectional views showing a cross section taken along the line VIII—VIII of FIG. 7 in the order of the process for repairing the defect. In the embodiment which will be described in the following, the repair of the defect is carried out on a thin X-ray exposure mask as described in the prior art. The pattern to be repaired is the pattern 1 formed of the tungsten thin film of 1 μm in thickness shown in FIG. 7 which has a defect portion 2 in which the pattern is lacking.

First, referring to FIG. 8A, the WF$_6$ gas is supplied in the vicinity of the defect portion 2 while the ion beam 4 irradiates the defect portion 2. On this occasion, the irradiation of the ion beam 4 is carried out so that it is always in contact with the edge of the pattern lacking of the defect portion 2. The condition of irradiation is as follows. The amount of irradiation of the ion beam is $1 \times 10^{18}/cm^2$, and the energy of the ion beam is 20 KeV. The WF$_6$ molecules deposited on the edge side surface of the defect portion 2 of the pattern 1 are decomposed by the irradiation of the ion beam 4, whereby a thin film of tungsten is formed along the side surface of the lacking edge of the pattern 1.

Thereafter, as shown in FIG. 8B, the position of irradiation of the ion beam 4 is successively moved as the position of the edge of the defect portion 2 changes with the growth of the deposition film 5, which is the tungsten thin film, in the transverse direction along the side surface of the lacking edge. In this manner, the deposition film 5 grows along the edge of the pattern 1 in the transverse direction as shown in FIG. 8C, whereby a deposition film 5 having the edge side surface almost vertical to the surface of the substrate 3.

Figure 9A:
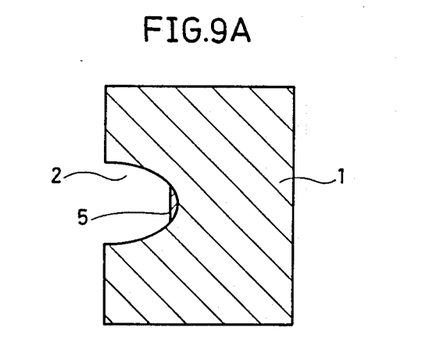
FIGS. 9A, 9B and 9C are plan views showing in the stepwise manner the process of repairing the defect in the pattern in accordance with the method for repairing the pattern of the present invention.
Figure 9B:
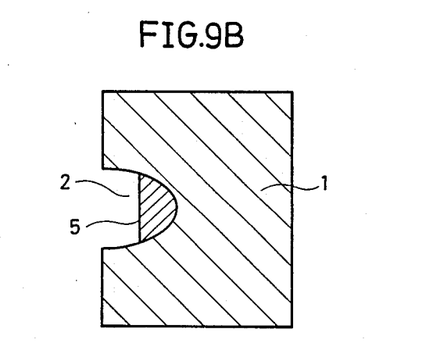
Figure 9C:
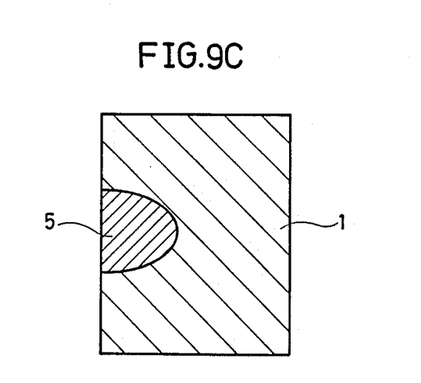

FIGS. 9A to 9C are plan views showing the above described process of repairing the defect. Since the irradiation of the ion beam is carried out along the edge of the pattern 1, the deposition film 5 is formed to fill the defect portion 2 which is the lacking portion of the pattern 1, as shown in the figure.

Figure 10A:
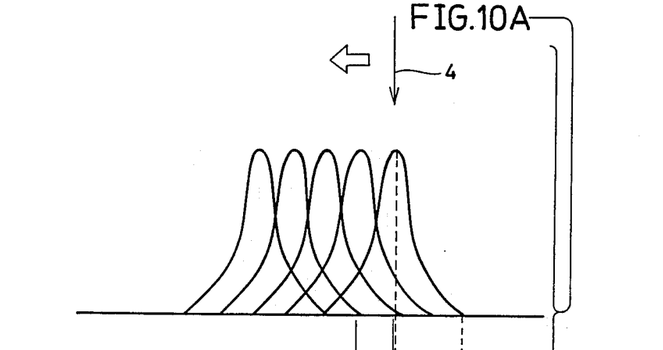
FIGS. 10A and 10B illustrate the relation between the energy distribution of the ion beam and the shape of the thin film formed by that ion beam in the method for repairing the pattern in accordance with the present invention.
Figure 10B:
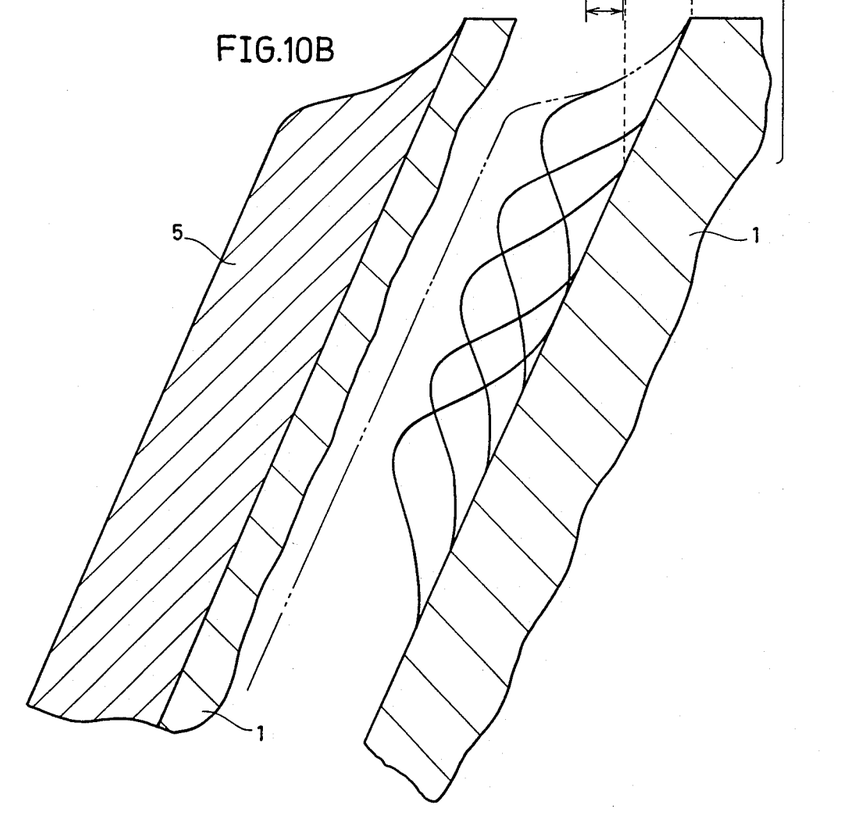

FIG. 10A illustrates the distribution of energy which is applied to the side wall portion of the pattern 1, namely, the edge side surface of the defect portion 2 by the ion beam irradiation according to the present invention, corresponding to the ion beam current distribution shown in FIG. 3. According to the figure, as the ion beam 4 successively moves and scans the pattern 1 with a prescribed interval d, the energy having the distribution approximately proportional to the beam current distribution is applied to the side wall portion of the pattern 1 having an inclined surface. The total sum of the energy is shown by the two-dotted line. When the ion beam 4 irradiates the side wall portion of the pattern 1 with such energy distribution and the gas is supplied, the deposition film 5 having the cross section such as shown in FIG. 10B is formed. As is apparent from the figure, the shape of the upper edge of the deposition film 5 reflects the extension of the foot of the beam current distribution while the shape in the scanning direction of the ion beam 4 has the shape along the side wall of the pattern 1. Therefore, according to the scanning of the ion beam of the present invention, although the upper shape of the deposition film 5 formed on the side wall which is the defect portion of the pattern 1 is inclined, the shape of the side surface reflects the side wall of the pattern 1, so that the deposition film 5 can be formed with the side surface being almost vertical to the substrate surface. In FIGS. 10A and 10B, the side wall of the pattern is shown with an inclination more moderate than the actual inclination.

Figure 11A:
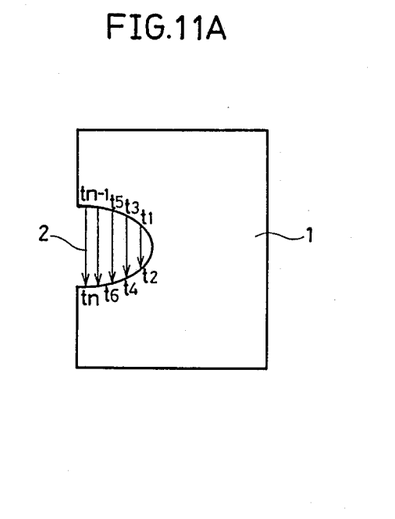
FIGS. 11A and 11B show the process of scanning of the ion beam in the method for repairing the pattern in accordance with the present invention.
Figure 11B:
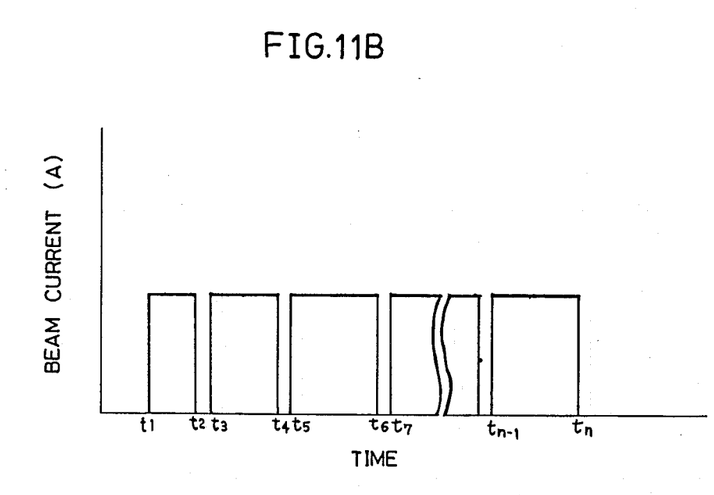

One embodiment of the scanning procedure of the ion beam in accordance with the present invention will be described with reference to the figures. FIG. 11A shows the order of the scanning by the ion beam on the defect portion 2 of the pattern 1 with arrows, and FIG. 11B shows the relation between the beam current and the time corresponding to the order of scanning shown in FIG. 11A. According to the figures, the ion beam 4 is continuously applied with a constant beam current so that it is always in contact with the edge of the pattern 1 and, as a deposition film 5 is formed to fill the defect portion 2 along the side wall surface of pattern 1, the position of irradiation of the ion beam is successively moved.

Although the method for repairing the defect of the pattern was employed for X-ray exposure mask in the above described embodiment, the repairing method of the present invention may be applied to the defects in the mask pattern such as an optical exposure mask, electron beam exposure mask and so on and to those in the wiring pattern of the semiconductor device. The similar method can be applied to the modification of the wiring pattern of the semiconductor device.

As described above, according to the present invention, the thin film for repairing the defect in the pattern can be successively formed along the side surface of the edge of the pattern, so that the shape of the side surface of the repaired pattern can be made approximately vertical to the substrate surface. Therefore, the reliability of the pattern is not lowered due to the repair of the pattern.

In addition, when the exposure mask having the pattern repaired by the method for repairing the pattern in accordance with the present invention is employed, the contrast in pattern transfer is not lowered.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method for repairing a pattern of a first thin film formed on a substrate, comprising the steps of:
   preparing a substrate having a main surface with said first thin film formed on the main surface selectively spaced apart in accordance with a prescribed pattern, wherein said first thin film has a defect portion which lacks said prescribed pattern thereby forming a void in said first thin film, said void having a side wall extending into said first thin film;
   (a) supplying a gas comprising the same kind of material as said first thin film, or other material of a thin film having the same function as said first thin film has in the vicinity of said defect portion;
   (b) selectively applying an energy beam having a prescribed energy to said side wall of said void, progressively directing said energy beam from an upper edge of said void, whereat said side wall intersects an upper surface of said first thin film, down to a lower edge whereat said side wall intersects said substrate, thereby decomposing said gas to form a second thin film on said wall of said void extending into said void whereby a new side wall of said void is formed, wherein said energy beam is successively applied so as at least to be always in contact with said side wall of said defect portion;
   (c) disabling application of said energy beam to said substrate when said energy beam is not in contact with said side wall of said defect portion; and successively repeating steps (b) and (c), thereby successively extending said side wall into said void until said void is substantially filled with said second thin film.

2. A method for repairing a pattern according to claim 1, wherein the thickness of said first thin film is more than 0.2 μm.

3. A method for repairing a pattern according to claim 2, wherein the pattern of the first thin film formed on said substrate constitutes a portion of an exposure mask.

4. A method for repairing a pattern according to claim 3, wherein said exposure mask comprises a X-ray exposure mask.

5. A method for repairing a pattern according to claim 4, wherein said energy beam comprises a focused ion beam.

6. A method for repairing a pattern according to claim 5, wherein said gas comprises $WF_6$ gas and said first thin film comprises a tungsten film.

7. A method for repairing a pattern according to claim 1, wherein the void has a substantially larger minimum diameter than an effective diameter of said energy beam whereat said energy beam is applied to said side wall of said defect portion void.

8. A method for filling a void in an exposure mask, said mask comprising a substrate having a main surface and a first thin film forming a prescribed pattern on said substrate wherein said void extends through said first thin film, said method comprising the steps of:
(a) supplying a gas including a material of said first thin film in the vicinity of said void;
(b) selectively applying an energy beam to a side wall of said void, successively from an upper edge of said side wall whereat said side wall intersects an upper surface of said first thin film, down to a lower edge of said side wall whereat said side wall intersects said substrate, and inhibiting application of said energy beam to said substrate while said energy beam is not in contact with said side wall said, thereby to decompose said gas and form a second thin film having a major surface formed on said side wall, said second thin film partially extending into and filling said void; and
(c) repeating step (b) until said void is substantially filled with said second thin film.

9. A method for repairing a pattern according to claim 8, wherein a minimum diameter of said void is substantially larger than an effective diameter of said energy beam whereat said energy beam is applied to said side wall of said void.

10. A method for filling a void in an exposure mask, said mask comprising a substrate having a main surface and a first thin film forming a prescribed pattern on said substrate wherein said void extends into said first thin film forming substantially vertical side walls therein and upper and lower edges whereat said vertical side walls intersect, respectively, an upper surface of said first thin film and said substrate, said method comprising the steps of:
(a) supplying a gas including a material of said first thin film in the vicinity of said void;
(b) selectively applying an energy beam to one of said side walls of said void, successively from one of said upper and lower edges to the other edge, inhibiting application of said energy beam to said substrate while said energy beam is not in contact with said one side wall of said void, thereby to decompose said gas and form a second thin vertical film on said side wall partially extending into and filling said void; and
(c) repeating step (b) until said void is substantially filled with a plurality of said second thin vertical films formed adjacent one another.

11. A method for repairing a pattern according to claim 10, wherein a minimum diameter of said void is substantially larger than an effective diameter of said energy beam whereat said energy beam is applied to said side wall of said void.

* * * * *